United States Patent [19]

Char et al.

[11] Patent Number: 5,207,884
[45] Date of Patent: May 4, 1993

[54] SUPERCONDUCTOR DEPOSITION SYSTEM

[75] Inventors: Kookrin Char, Palo Alto; Nathan Newman, Montara, both of Calif.; John M. Rowell, Berkeley Heights, N.J.

[73] Assignee: Conductus, Inc., Sunnyvale, Calif.

[21] Appl. No.: 633,275

[22] Filed: Dec. 24, 1990

[51] Int. Cl.$^5$ .......................... B05D 3/06; C23C 14/00
[52] U.S. Cl. ............................... 204/298.02; 118/620; 118/727; 505/1; 204/298.09; 204/298.28
[58] Field of Search .................... 204/298.02, 298.04, 204/298.07, 298.09, 298.23, 298.28; 427/53.1; 118/726, 620, 727; 505/1, 732

[56] References Cited

U.S. PATENT DOCUMENTS

| | | | |
|---|---|---|---|
| 4,664,940 | 5/1987 | Bensoussan et al. | 427/53.1 |
| 4,793,908 | 12/1988 | Scott et al. | 204/298.04 X |
| 4,892,751 | 1/1990 | Miyake et al. | 427/53.1 X |
| 4,923,585 | 5/1990 | Krauss et al. | 204/298.04 |
| 5,015,492 | 5/1991 | Venkatesan et al. | 427/53.1 X |

OTHER PUBLICATIONS

Ying et al., "... study ... YBaCuO", Appl. Phys. Lett. 53(18), Oct. 1988, pp. 1762-1764.
Neifeld et al., "Systematics ... SmBa$_2$Cu$_3$O$_7$", Appl. Phys. Lett. 53(8), Aug. 1988, pp. 703-704.
Campers et al., "YBaCuO ... evaporation", Appl. Phys. Lett. 52(7), Feb. 1988, pp. 584-586.
Lynds et al., "High T$_c$... Ablation", American Inst. of Phys., Conf. Proceed. No. 165, Nov. 1987, Anaheim, Calif. 1987.

*Primary Examiner*—Nam Nguyen
*Attorney, Agent, or Firm*—Marvin E. Jacobs

[57] ABSTRACT

To deposit a plurality of substances on a substrate while the substrate remains in a low pressure oxygen environment, several target carriers are mounted around the edge of a disc and the disc is rotated to position the targets at the focal point of a fixed laser. The target carriers are themselves rotatable in bearings on the disc and are turned by a sun gear that is carried about the same shaft that turns the disc so that the heat of the laser beam is not concentrated at one spot on the surface of the target. All the apparatus is contained in a oxygen chamber. The substrate is heated and the targets are cooled continuously.

5 Claims, 1 Drawing Sheet

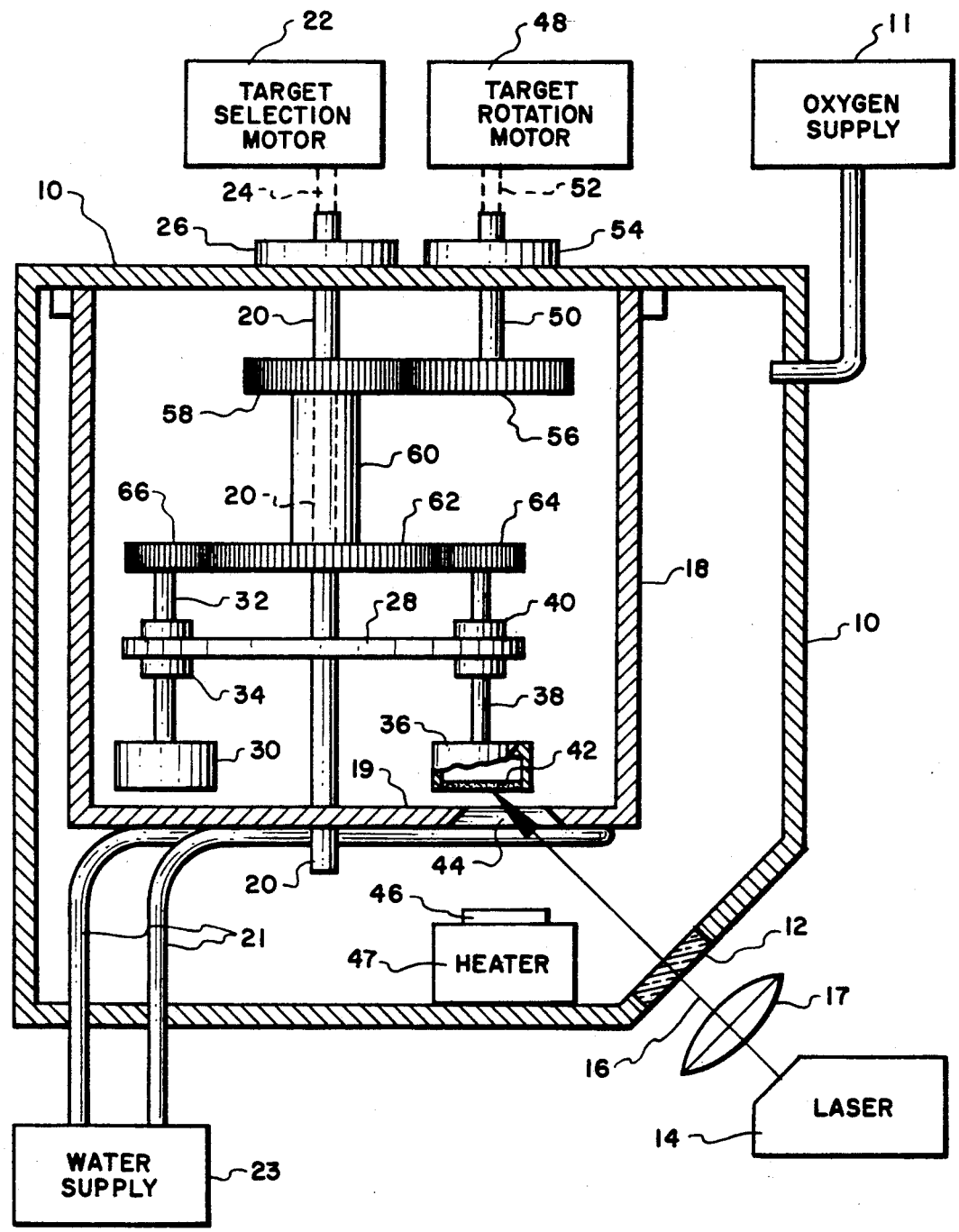

SUPERCONDUCTOR DEPOSITION SYSTEM

DESCRIPTION

1. Technical Field

This invention relates to apparatus and methods to form high critical temperature superconductors on substrates. In particular, a system is disclosed to position a plurality of different targets before a laser in a desired sequence so that the targets may be evaporated on to a substrate while the substrate remains in a low pressure oxygen environment.

2. Background of the Invention

Superconductors have zero electrical resistance at low temperatures. Recently discovered high critical temperature superconductors achieve zero resistance at temperatures as high as 120 degrees Kelvin or more. These materials require the fabrication of crystal structures with very perfect copper-oxygen planes to support the current flow. A typical example of a copper oxide compound commonly used for this purpose is made from Yttrium, Barium, Copper and Oxygen.

It is known in the art to form the desired crystal structures by vaporizing the compound with a laser and allowing the gaseous atoms to deposit slowly on a substrate. Good crystals may be grown this way. However, keeping the stoichiometric ratios at the desired levels after deposition is very difficult since oxygen migrates easily in and out of the copper-oxygen planes. Hence, it is good practice to deposit the layers in a carefully controlled low pressure oxygen environment. While maintaining this oxygen environment, layers of insulating material, contact material, and all the other layers needed to create a finished electronic device are deposited. Only when the device is complete and sealed against external contamination, is it removed from the oxygen environment.

As a result, a need arises for apparatus to sequentially position a multiplicity of targets at the focus of the laser in order to deposit all of the needed materials while sustaining the oxygen environment. This apparatus must operate inside an oxygen chamber. The present invention provides such an apparatus.

SUMMARY OF THE INVENTION

Briefly, the targets for the laser are carried on a rotatable disc which disc is rotated by a shaft so as to position the targets at the focus point of the laser. The substrate to be coated is mounted close by and is fixed in place relative to the focus point of the laser. In this way, the distance and position of the substrate relative to the laser induced vapor plume from the target remains constant which causes the deposition process to be predictable and controllable.

Also, the optics for the laser are sensitive and require careful adjustment. So once proper focus and adjustment are achieved, it is best to leave these parameters fixed and move the targets into the focal point.

Not only is each target sequentially exposed to the laser focus point, but the targets are themselves rotated so as to continuously move the surface of the target material through the focus point. This second movement prevents the laser beam from digging a hole in the target surface at one location which would defocus the laser and overheat the target in one spot. This second movement also spreads the heat of the laser over the target material and evens out the vaporization process. Target rotation is accomplished with a central or sun gear that rotates about the disc carrying shaft and engages gears connected to the targets themselves. The targets are mounted in bearings in the above described rotatable disc permitting them to spin about their own axes. The detailed description that follows, and the drawing, describe further benefits and advantages to the instant invention.

BRIEF DESCRIPTION OF THE DRAWING

The drawing shows an elevational schematic representation of the invention, drawn not necessarily to scale, so as to provide the maximum clarity.

DETAILED DESCRIPTION OF THE INVENTION

The drawing shows a chamber 10, in section, constructed in accordance with methods well known to those skilled in the art. Chamber 10 may be generally cylindrical in shape so as to surround the target carrying mechanisms. An oxygen supply 11 maintains a low pressure of oxygen in chamber 10, typically from a few to a few hundred millitorr, in a manner well known to those skilled in the art. A sealed window 12 permits a laser 14 to direct an intense laser beam 16 through suitable optical focusing means, shown schematically as a lens 17, into the chamber 10. Laser beam 16 is directed in at an angle so as to avoid the plume of vaporized material that rises more or less perpendicular from the surface of the targets. A support housing 18, which also may be cylindrical, is mounted inside oxygen chamber 10. Housing 18 includes a generally flat horizontal plate 19 at the bottom. Plate 19 has a cooling tube 21 brazed in a labyrinth pattern to its lower surface. Tube 21 carries cooling water from a supply 23 to remove excess heat from the targets for reasons that will be explained presently.

A first shaft 20 is rotatably supported at its upper end by chamber 10, and at its lower end by plate 19. Shaft 20 is rotated by a target selection motor 22 through a suitable mechanical connection represented by dashed line 24 in the drawing. A rotary motion feedthrough 26 allows transmission of the shaft rotation into the chamber 10 in a manner well known to those skilled in the art.

A disc 28 is carried on shaft 20. A plurality of target holders may be rotatably mounted about the periphery of disc 28. Six target holders are envisioned in the preferred embodiment, however, only two holders, 30 and 36, are shown in the drawing to enhance clarity. Holder 30 is mounted at the lower end of a shaft 32. Shaft 32 in turn is rotatably carried by a bearing 34 on the edge of disc 28. In a like manner, holder 36 is mounted on a shaft 38 in a bearing 40. Holder 36 is cut away in the drawing to show a target compound 42 mounted inside. When a new target material is required, motor 22 is used to rotate shaft 20 and disc 28 so as to position the next target holder above a hole 44 in plate 19. In this position, the laser beam 16 can vaporize the target compound in the holder. The evaporated atoms from the target pass through hole 44 and accumulate on a substrate 46 located below the hole 44.

Substrate 46 is mounted on a heater 47 of a type also known to those skilled in the art. Proper deposition of high temperature superconductors requires elevated substrate temperatures. However, the heat from the laser and the heated substrate tends to overheat target compounds 42. When this happens, the compound 42 may come off in larger aggregations of atoms rather than as the desired vapor. The present invention avoids this problem by rotating the targets in close proximity to the top surface of cooling plate 19 so as to cool the targets, primarily by conduction through the oxygen gas in chamber 10.

To avoid digging a hole in the target surface with the laser beam, the target holders are themselves also rotatable in the bearings 34 and 40 on disc 28. A motor 48 turns a second shaft 50 by means of a connection 52 and a feedthrough 54. A gear 56, at the bottom of shaft 50, engages and turns a gear 58 which turns a tubular shaft 60. Shaft 60 concentrically surrounds shaft 20 and carries a central sun gear 62 at the lower end. Sun gear 62 engages a set of planetary gears 64 and 66 connected to the tops of target holder shafts 32 and 38. Alternative to this geared arrangement, the target rotation could be effected by belts or chains that connect shaft 50, shaft 60, and shafts 32 and 38. Thus, whichever target holder is above hole 44, it is continuously spinning so that the laser will not burn a hole in one part of the target compound 42.

We claim:

1. A deposition system to vaporize materials onto a substrate comprising in combination:
    a chamber having a portion transparent to a laser beam;
    a laser positioned to direct a beam through said transparent portion to a focus point at a first location inside said chamber;
    support means inside said chamber;
    first rotatable shaft means inside said chamber and carried by said support means;
    a plurality of rotatable target carriers mounted on said first shaft means for rotation therewith into position at said first location, said target carriers being rotatable in planetary bearings, which planetary bearings are disposed in the periphery of a disc member, said disc member mounted on said first shaft means for rotation therewith; and
    target carrier rotating means connected to said carriers so as to rotate said carriers during said vaporization by said laser beam and move the surface of targets in said target carriers through said focus point at said first location, said carrier rotating means including a sun gear concentrically surrounding said first shaft means for rotation thereabout, said sun gear engaging and turning planetary gears connected to said carriers and also including a tubular shaft concentrically surrounding said first shaft means and connected to said sun gear, and further including a second gear on said tubular shaft engaging and driven by a drive gear connected to a second shaft means.

2. The system of claim 1 including motor means connected to drive said first and second shaft means.

3. The system of claim 2 including a cooling plate mounted proximate to said target carriers and also including cooling means connected to cool said cooling plate.

4. The system of claim 3 including oxygen supply means connected to said chamber so as to maintain a lower pressure oxygen environment therein.

5. A deposition system to vaporize materials onto a substrate comprising in combination;
    a sealed chamber adapted to contains a controlled environment and having a portion transparent to a laser beam;
    a laser outside said chamber positioned to direct a beam through said transparent portion to a focus point at a first location inside said chamber;
    first support means inside said chamber;
    first rotatable shaft means inside said chamber and rotatably carried by said first support means;
    second support means mounted on said first shaft means so as to be rotatable therewith;
    a plurality of rotatable target carriers mounted on said second support means for rotation therewith;
    targets comprising material to be vaporized, said targets mounted on said target carriers;
    first motive means connected to said first shaft means and adapted to rotate the shaft, second support means, and target carriers so as to move the targets into said focus point;
    second rotatable shaft means concentric about said first shaft means and rotatable around said first shaft means, said first shaft means providing support to said second shaft means, said second shaft means having a sun gear concentrically mounted thereabout and rotatable therewith;
    target carrier rotating gear means connected to said carriers so as to rotate said carriers, said target carrier to rotating gear means engaging said sun gear on said second shaft means so as to be rotated thereby;
    second motive means connected to rotate said second shaft means during vaporization by said laser beam so as to continuously move the surface of targets on said target carriers through said focus at said first location; and
    substrate mounting means in said chamber adapted to hold a substrate in a position proximate to said focus point so as to receive vaporized material from said targets.

* * * * *